(12) United States Patent
Hutamura et al.

(10) Patent No.: US 6,891,708 B2
(45) Date of Patent: May 10, 2005

(54) REDUCED CURRENT AND POWER CONSUMPTION STRUCTURE OF DRIVE CIRCUIT

(75) Inventors: Takaharu Hutamura, Anjo (JP); Shoichi Okuda, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/944,118

(22) Filed: Sep. 4, 2001

(65) Prior Publication Data

US 2002/0027391 A1 Mar. 7, 2002

(30) Foreign Application Priority Data

Sep. 5, 2000 (JP) ........................................ 2000-268539

(51) Int. Cl.$^7$ ................................................ H02H 3/20
(52) U.S. Cl. .......................................... 361/100; 361/90
(58) Field of Search ............................. 361/18, 58, 90, 361/91.1, 91.2, 92, 100, 101; 307/130, 131, 125; 330/255, 257

(56) References Cited

U.S. PATENT DOCUMENTS

| | | | | |
|---|---|---|---|---|
| 5,121,011 A | * | 6/1992 | Ohya et al. .................. 327/432 |
| 5,442,320 A | * | 8/1995 | Kunst et al. ................. 330/267 |
| 5,473,263 A | * | 12/1995 | Mahmood .................... 326/27 |
| 5,705,952 A | * | 1/1998 | Hattori ........................ 330/255 |
| 5,808,455 A | * | 9/1998 | Schwartz et al. ........... 323/271 |
| 5,847,554 A | * | 12/1998 | Wilcox et al. ............... 323/282 |
| 5,982,160 A | * | 11/1999 | Walters et al. .............. 323/282 |
| 6,018,450 A | * | 1/2000 | Ahmad et al. ............... 361/90 |
| 6,043,702 A | * | 3/2000 | Singh .......................... 327/534 |
| 6,060,921 A | * | 5/2000 | Daniell ....................... 327/170 |
| 6,069,471 A | * | 5/2000 | Nguyen ....................... 323/271 |
| 6,201,378 B1 | * | 3/2001 | Eto et al. ..................... 323/313 |
| 6,208,043 B1 | * | 3/2001 | Hurst et al. ................. 307/130 |
| 6,316,999 B1 | * | 11/2001 | Kato ........................... 330/255 |
| 6,437,638 B1 | * | 8/2002 | Coles et al. ................. 327/540 |

FOREIGN PATENT DOCUMENTS

| | | |
|---|---|---|
| JP | A-7-245988 | 9/1995 |
| JP | A-8-79049 | 3/1996 |
| JP | A-9-172358 | 6/1997 |
| JP | A-10-174457 | 6/1998 |
| JP | A-11-205112 | 7/1999 |
| JP | A-11-330936 | 11/1999 |

* cited by examiner

*Primary Examiner*—Stephen W. Jackson
*Assistant Examiner*—Danny Nguyen
(74) *Attorney, Agent, or Firm*—Posz Law Group, PLC

(57) ABSTRACT

A drive circuit for driving a switching element is provided which includes a high-side switching circuit connected between power supply lines, a low-side switching circuit connected in series with the high-side switching circuit through an output terminal leading to the switching element, and a voltage detector detecting a voltage appearing at the output terminal. When the voltage detected by the voltage detector is lower than a given off-decision voltage, that is, when the switching element is placed in the off-state, the low-side switching circuit is brought into the off-state, thereby reducing the current consumption thereof.

26 Claims, 8 Drawing Sheets

REDUCED CURRENT AND POWER CONSUMPTION STRUCTURE OF DRIVE CIRCUIT

BACKGROUND OF THE INVENTION

1. Technical Field of the Invention

The present invention relates generally to a drive circuit in which a high-side switching circuit and a low-side switching circuit are connected in series between power supply lines through an output terminal leading to a switching element to be controlled by the drive circuit, and more particularly to a reduced current and power consumption structure of such a drive circuit.

2. Background Art

FIGS. 9 and 10 show a conventional drive circuit 1 designed to control an on-off operation of a switching element.

The drive circuit 1 is fabricated on an IC and designed to receive a control signal Sa inputted to an input terminal 2 to provide a drive voltage signal Vo to, for example, a gate of an n-channel MOSFET 4 coupled to an output terminal 3. The drive circuit 1 includes a high-side transistor T1, a low-side transistor T2, and a resistor R1. The high-side transistor T1 and the low-side transistor T2 are connected at collectors and emitters thereof in series between a positive power supply line 5 and a negative power supply line 6 (also referred to as a ground line 6 below) through the resistor R1. A junction of the resistor R1 and the collector of the low-side transistor T2 is coupled to the output terminal 3.

The drive circuit 1 also includes predrivers 7 and 8, a transistor T3, and a constant current source CS1. The transistor T3 is, as clearly shown in FIG. 10, disposed between the input terminal 2 and input terminals of the predrivers 7 and 8. The constant current source CS1 works to provide a bias current to the transistor T3. The predrivers 7 and 8 receive a signal from the transistor T3 to operate in logical forms reverse to each other and drive the transistors T1 and T2, respectively.

Specifically, the drive circuit 1 is a push-pull circuit which is responsive to the control signal Sa of a low level inputted to the input terminal 2 to turn on the transistor T1 and off the transistors T2 and T3 so that the voltage Vb is applied from the power supply line 5 to the gate of the MOSFET 4 to turn on the MOSFET 4. When the control signal Sa of a high level is inputted to the input terminal 2, the transistors T2 and T3 are turned on, while the transistor T1 is turned off, so that the voltage of zero (0) at the ground line 6 is applied to the gate of the MOSFET 4 to turn off the MOSFET 4.

FIG. 9 illustrates the structure of the drive circuit 1. The predrivers 7 and 8 have common elements for simplifying structures thereof. Specifically, the predrivers 7 and 8 are made up of the transistor T4, a transistor T5, a transistor T6, and resistors R2 to R8. The transistor T4 works to turn off the transistor T1 and turns on the transistor T2. The transistor T5 works to turn off the transistor T2. The transistor T6 works to drive the transistor T4.

When the transistor T3 is turned off by the control signal Sa of the low level, it will cause the transistors T5 and T6 to be turned on and the transistor T4 to be turned off, so that the transistor T1 is turned on, and the transistor T2 is turned off. Alternatively, when the transistor T3 is turned on by the control signal Sa of the high level, it will cause the transistors T5 and T6 to be turned off and the transistor T4 to be turned on, so that the transistor T1 is turned off, and the transistor T2 is turned on.

Between the gate and the source and between the gate and the drain of the MOSFET 4, capacitors Cgs and Cgd are usually provided, respectively. These gate capacitors are illustrated by broken lines in FIG. 10. Decreasing turning-on and -off time periods of the MOSFET 4 to achieve a rapid switching operation thereof requires an increased ability of the drive circuit 1 to produce a great current for charging and discharging the gate capacitors of the MOSFET 4 when required to be switched between the on-state and the off-state.

Accordingly, in the drive circuit 1, the base current of the transistor T2 is set to a great value for enabling the transistor T2 to withdraw as the collector current thereof the electric charge from the gate capacitors for a short time when the MOSFET 4 is switched from the on-state to the off-state. Additionally, the base current of the transistor T1 is set to a great value for enabling the transistor T1 to charge the gate capacitors of the MOSFET 4 for a short time with the collector current thereof when the MOSFET 4 is switched from the off-state to the on-state. The adjustment of these base currents is achieved by regulating the resistance values of the resistors R4 and R6.

The base current of the transistor T2 inputted from the power supply line 5 through the resistor R6 and the transistor T4 continues to flow not only when the transistor T2 is switched between the on- and off-states, but also during a steady-state operation in which the transistor T2 is in the on-state (i.e., the MOSFET 4 is in the off-state). An increase in base current of the transistor T2 for shortening the turning-off time period thereof, thus, causes the current consumption of the drive circuit 1 to increase, which results in an increase in quantity of heat generated by the resistors R4 and R6. This requires a decrease in guarantee ambient temperature of the IC in which the drive circuit 1 is located.

In a case of a drive circuit (not shown) designed to drive a p-channel MOSFET, a great base current of a high-side transistor continues to flow when it is in the on-state for the same reasons as described above, thus resulting in an increase in energy loss of the drive circuit.

SUMMARY OF THE INVENTION

It is therefore a principal object of the invention to avoid the disadvantages of the prior art.

It is another object of the invention to provide a drive circuit whose current and power consumption is decreased without sacrificing the switching speed of a switching element to be controlled by the drive circuit.

According to one aspect of the invention, there is provided a drive circuit for driving a switching element. The drive circuit comprises: (a) a high-side switching circuit connected between power supply lines; (b) a low-side switching circuit connected in series with the high-side switching circuit through an output terminal leading to the switching element; and (c) a voltage detector detecting a voltage appearing at the output terminal. The low-side switching circuit is controlled to be turned off when the voltage detected by the voltage detector is lower than an off-decision voltage which is defined within a voltage range in which the switching element is in an off-state.

In the preferred mode of the invention, the high-side switching circuit includes an output transistor, a predriver driving the output transistor, a comparing circuit comparing the output voltage detected by the voltage detector with the on-decision voltage, and a logic circuit controlling an operation of the predriver based on a result of comparison in the comparing circuit.

The comparing circuit includes a decision transistor having a control terminal into which the output voltage detected by the voltage detector is inputted.

The voltage detector is implemented by a voltage divider made up of resistors.

According to the second aspect of the invention, there is provided a drive circuit for driving a switching element which comprises: (a) a high-side switching circuit connected between power supply lines; (b) a low-side switching circuit connected in series with the high-side switching circuit through an output terminal leading to the switching element; and (c) a voltage detector detecting a voltage appearing at the output terminal. The high-side switching circuit is turned off when the voltage detected by the voltage detector is higher than an on-decision voltage which is defined within a voltage range in which the switching element is in an on-state.

In the preferred mode of the invention, the high-side switching circuit includes an output transistor, a predriver driving the output transistor, a comparing circuit comparing the output voltage detected by the voltage detector with the on-decision voltage, and a logic circuit controlling an operation of the predriver base on a result of comparison in the comparing circuit.

The comparing circuit includes a decision transistor having a control terminal into which the output voltage detected by the voltage detector is inputted.

The voltage detector is implemented by a voltage divider made up of resistors.

According to the third aspect of the invention, there is provided a drive circuit for driving a switching element which comprises: (a) a high-side switching circuit connected between power supply lines; (b) a low-side switching circuit connected in series with the high-side switching circuit through an output terminal leading to the switching element; and (c) a voltage detector detecting a voltage appearing at the output terminal. The low-side switching circuit is turned off when the voltage detected by the voltage detector is lower than an off-decision voltage which is defined within a voltage range in which the switching element is turned off. The high-side switching circuit is turned off when the voltage detected by the voltage detector is higher than an on-decision voltage which is defined within a voltage range in which the switching element is turned on.

In the preferred mode of the invention, the low-side switching circuit includes an output transistor, a predriver driving the output transistor, a comparing circuit comparing the output voltage detected by the voltage detector with the off-decision voltage, and a logic circuit controlling an operation of the predriver base on a result of comparison in the comparing circuit.

The high-side switching circuit includes an output transistor, a predriver driving the output transistor, a comparing circuit comparing the output voltage detected by the voltage detector with the on-decision voltage, and a logic circuit controlling an operation of the predriver base on a result of comparison in the comparing circuit.

The comparing circuit includes a decision transistor having a control terminal into which the output voltage detected by the voltage detector is inputted.

The voltage detector is implemented by a voltage divider made up of resistors.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
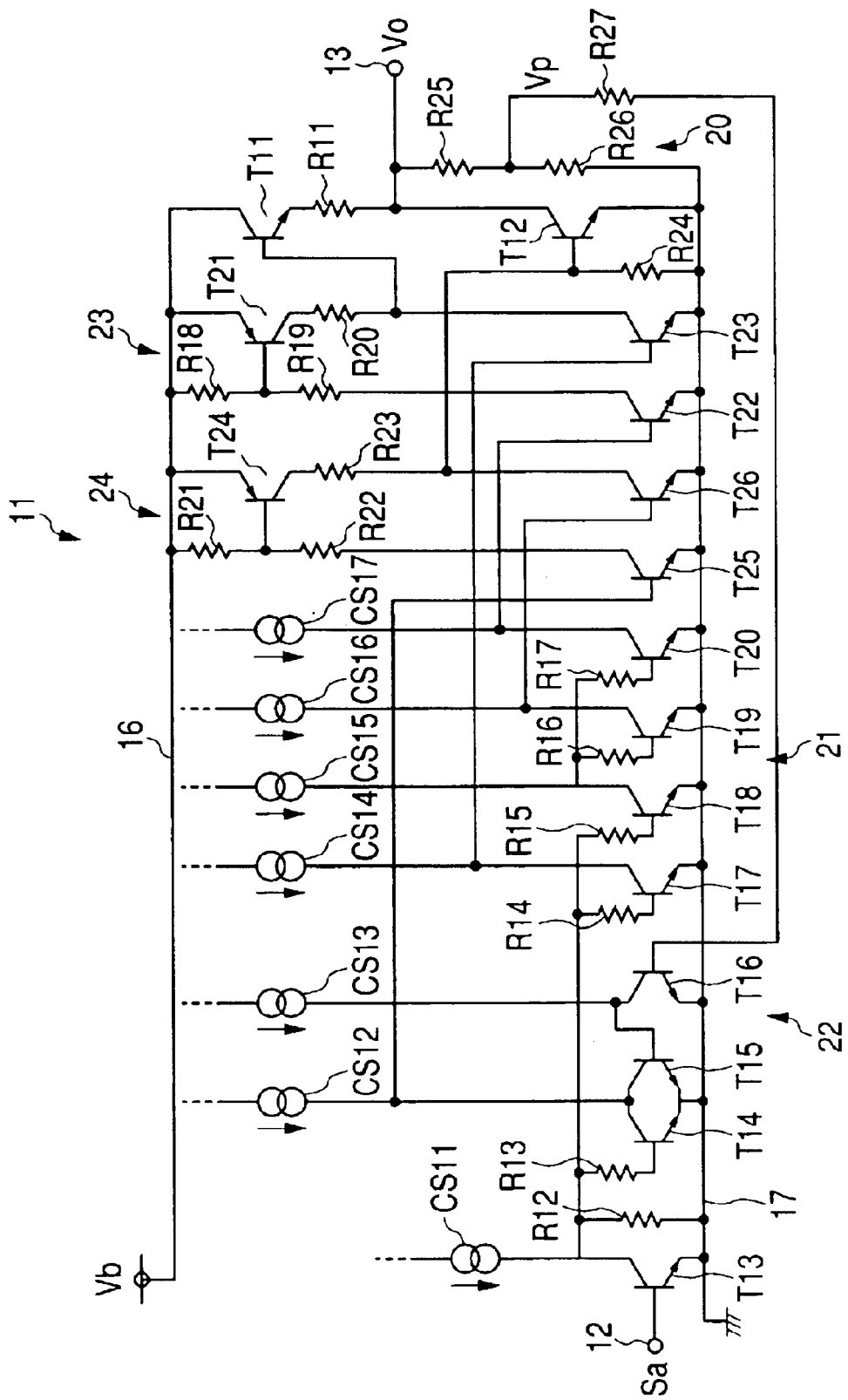
FIG. 1 is a circuit diagram which shows a structure of a drive circuit according to the first embodiment of the invention.

Referring to the drawings, wherein like reference numbers refer to like parts in several views, particularly to FIGS. 1 to 4, there is shown a multi-channel driver according to the first embodiment of the invention.

Figure 2:
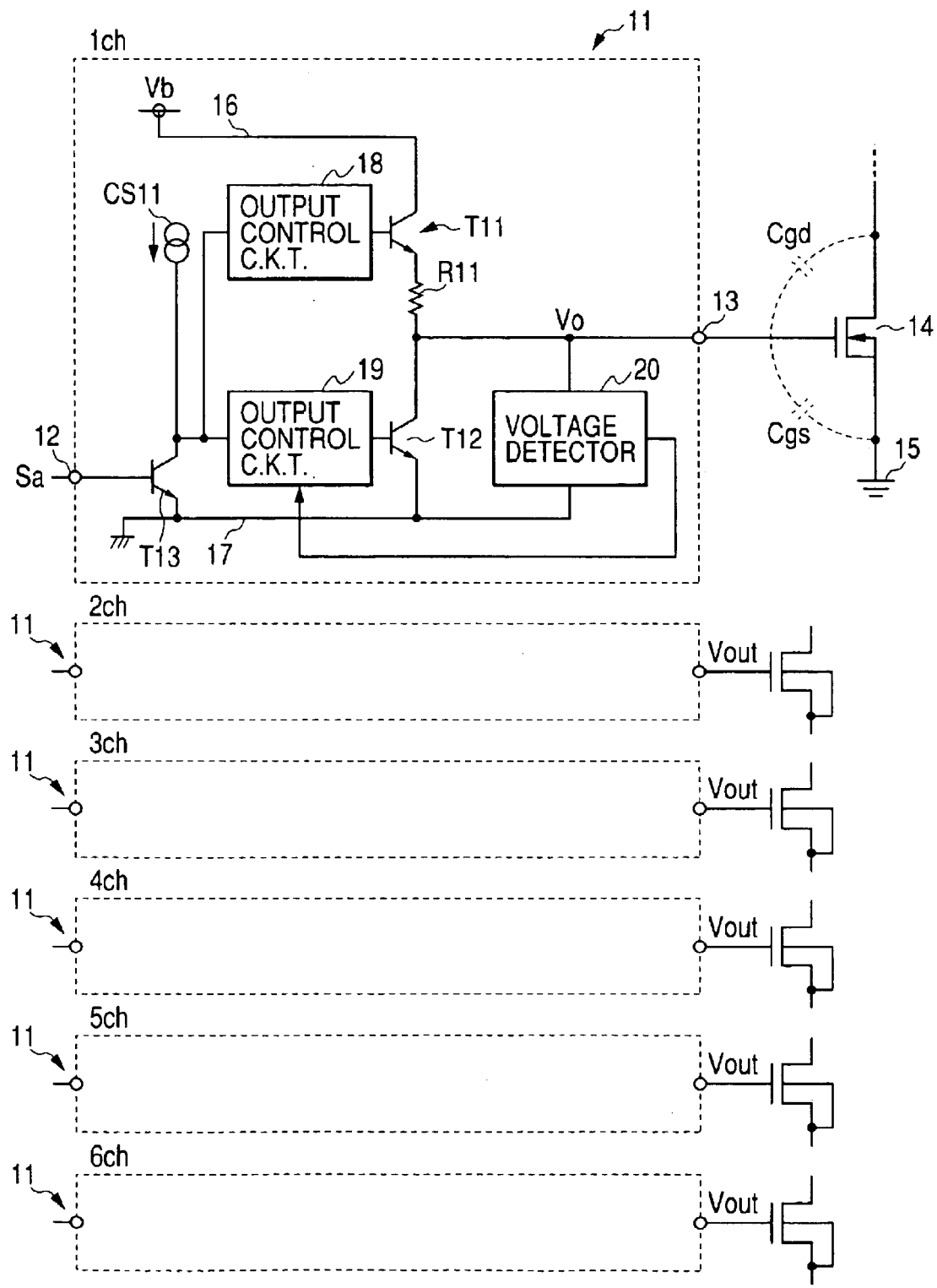
FIG. 2 is a block diagram which shows a multi-channel driver equipped with a plurality of drive circuits equivalent to the one shown in FIG. 1.

FIG. 2 illustrates, as an example, a schematic circuit structure of a six-channel driver made up of six drive circuits 11. The following discussion will refer to, as an example, a case of use in engine control for automotive vehicles. The six drive circuits 11 are fabricated in one IC together with other circuits.

Each of the drive circuits 11 is designed to receive a control signal Sa inputted to an input terminal 12 of the IC in which the drive circuits 11 are fabricated from a CPU (not shown) to provide a drive voltage signal Vo to a gate of an n-channel MOSFET 14 through an output terminal 13 of the IC.

Between a drain of the MOSFET 14 and a positive terminal of a battery (i.e., a dc power supply) installed in the vehicle, an electric load such as a solenoid (not shown) is disposed. A source of the MOSFET 14 is coupled to a ground line 15 leading to a negative terminal of the battery. Capacitors Cgs and Cgd are provided inherently between the gate and the source and between the gate and the drain of the MOSFET 14, which are illustrated equivalently in FIG. 2 by broken lines.

A positive power supply line 16 and a negative power supply line 17 (referred to as a ground line below) are coupled to the battery through an ignition switch (not shown), so that a power supply voltage (e.g., 14 V) is developed therebetween. Between the power supply line 16 and the ground line 17, a collector and an emitter of an npn transistor T11, a resistor R11, and a collector and an emitter of an NPN transistor T12 are connected. A junction of the resistor R11 and the collector of the transistor T12 is coupled to the output terminal 13. The transistors T11 and T12 work as a high-side transistor and a low-side transistor, respectively.

The drive circuit 11 includes an output control circuit 18 for driving the transistor T11, an output control circuit 19 for driving the transistor T12, an npn transistor T13 disposed between the input terminal 12 and an input terminal of each of the output control circuits 18 and 19, a constant current source CS11, and a voltage detector 20. The voltage detector 20 is disposed between the output terminal 13 and the ground line 17 and works to detect the voltage (i.e., the voltage signal Vo) appearing at the output terminal 13. The transistor T11 and the output control circuit 18 function as a high-side switching circuit. The transistor T12 and the output control circuit 19 function as a low-side switching circuit.

FIG. 1 illustrates the details of the structure of the drive circuit 11.

The drive circuit 11 includes a logic circuit 21 and a comparator 22. The logic circuit 21 consists of constant current sources CS12 and CS14–CS17, npn transistors T14, T15, and T17–T20, and resistors R12–R17. The comparator 22 consists of a constant current source CS13 and an npn transistor T16 serving as a decision transistor.

The drive circuit 11 also includes a high-side predriver 23 and a low-side predriver 24. The predriver 23 consists of a pnp transistor T21, npn transistors T22 and T23, and resistors R18 to R20. The predriver 24 consists of a pnp transistor T24, npn transistors T25 and T26, and resistors A21 to R24.

The output control circuit 18 shown in FIG. 2 includes the logic circuit 21 and the predriver 23. The output control circuit 19 shown in FIG. 2 includes the logic circuit 21, the comparator 22, and the predriver 24. Specifically, the logic circuit 21 is used both in the output control circuits 18 and 19.

In the logic circuit 21, the transistors T14 and T15 are coupled at collectors and emitters thereof in parallel to the constant current source CS12 and the ground line 17. The transistors T17 to T20 are coupled at collectors and emitters thereof to the constant current sources CS14 to CS17 and the ground line 17, respectively. The transistors T14, T17, and T18 are coupled at bases thereof to the collector of the transistor T13 through the resistors R13, R14, and R15, respectively. The transistors T19 and T20 are coupled at bases thereof to the collector of the transistor T18 through the resistors R16 and R17, respectively The transistor T15 is coupled at the base thereof to the collector of the transistor T16.

In the predriver 23, the resistors R18 and R19 and an emitter and a collector of the transistor T22 are coupled in series between the power supply line 16 and the ground line 17. An emitter and a collector of the transistor T21, the resistor R20, and a collector and an emitter of the transistor T23 are coupled in series between the power supply line 16 and the ground line 17. The transistors T21, T22, and T23 are coupled at bases thereof to a junction of the resistors R18 and R19, the collector of the transistor T20, and the collector of the transistor T17, respectively. The transistor T23 is coupled at the collector thereof to the base of the transistor T11.

In the predriver 24, the resistors R21 and R22 and a collector and an emitter of the transistor T25 are coupled in series between the power supply line 16 and the ground line 17. An emitter and a collector of the transistor T24, the resistor R23, and a collector and an emitter of the transistor T26 are coupled in series between the power supply line 16 and the ground line 17. The transistors T24, T25, and T26 are coupled at bases thereof to a junction of the resistors R21 and R22, the collectors of the transistors T14 and T15, and the collector of the transistor T19, respectively. The resistor R24 is coupled to the base and emitter of the transistor T12.

The voltage detector 20 is implemented by a voltage divider consisting of resistors R25 and R26 connected in series between the output terminal 13 and the ground line 17. The voltage detector 20 works to produce an output voltage Vp as a function of the output voltage Vo appearing at the output terminal 13 and applies it to the base of the transistor T16 through the resistor R27. The output voltage Vp is expressed by an equation below.

$$Vp = R26/(R25+R26) \cdot Vo \qquad (1)$$

Where R25 and R26 indicate resistance values of the resistors R25 and R26, respectively. In the following discussion, resistance values of the resistors R11 to R27 will also be expressed by R11 to R27, respectively.

In this embodiment, in order to decrease the current flowing through the voltage detector 20, R25=1 kΩ, and R26=100 kΩ. The output voltage Vp may be expressed in the following close approximation.

$$Vp = Vo \qquad (2)$$

The operation of the drive circuit 11 will be described below with reference to FIGS. 3 and 4.

First, an operation of the drive circuit 11 during a change in level of the control signal Sa inputted to the input terminal 12 will be discussed. In the following discussion, "L-level" indicates a voltage level (e.g., 0V) lower than the base-to-emitter voltage Vf(about 0.7V) of a transistor, e.g., the transistor T13, and "H-level" indicates a voltage level higher than or equal to the voltage Vf. The control signal Sa is an H-level pulse signal whose pulse spacing is, for example, 4 ms and pulse width is 200 to 400 μs.

(1) When the Control Signal Sa is Changed from the H-level to the L-level

A change in level of the control signal Sa from the H-level to the L-level causes the transistor T13 to be turned off, the transistors T14, T17, and T18 to be turned on, and the transistors T19 and T20 to be turned off. The turning on of the transistor T14 causes the collector voltage of the transistors T14 and T15 to be changed to the L-level regardless of the level of the output voltage Vp.

The above operation of the logical circuit 21 causes, on the high side, the transistor T22 to be turned on, the transistor T23 to be turned off, and the transistors T21 and T11 to be turned on, while it causes, on the low side, the transistor T25 to be turned off, the transistor T26 to be turned on, and the transistors T24 and T12 to be turned off.

Specifically, when the control signal Sa is decreased in level, the drive circuit 11 supplies a charging current from the power supply line 16 through the transistor T11, the resistor R11, and the output terminal 13 to the gate capacitors of the MOSFET 14. This causes the gate of the MOSFET 14 to be activated so that the output voltage Vo to rise rapidly from 0V to a level substantially equal to the voltage Vb appearing at the power supply line 16 When the output voltage Vo exceeds a threshold value Vth of the MOSFET 14, it will cause the MOSFET 14 to be turned on.

(2) When the Controls Signal Sa is Changed from the L-level to the H-level

An increase in level of the control signal Sa from the L-level to the H-level causes the transistor T13 to be turned on, the transistors T14, T17, and T18 to be turned off, and the transistors T19 and T20 to be turned on. This causes, on the high side, the transistor T22 to be turned off, the transistor T23 to be turned on, and the transistors T21 and T11 to be turned off. The collector voltage of the transistors T14 and T15, i.e., the on-off state of the transistors T24, T25, and T12 on the low side depend upon the level of the output voltage Vo.

Specifically, during a time when the output voltage Vo meets a relation, as shown below, after the control signal Sa is increased to the H-level, the transistor T16 is in the on-state, so that the transistor T15 is in the off-state.

$$Vo \geq (R25+R26)/R26 \cdot Vf \quad (3)$$

During the above time period, the collector of the transistors T14 and T15 is in the H-level, thereby causing the transistor T25 to be turned on, the transistor T26 to be turned off, and the transistors T24 and T12 to be turned on.

Thus, the drive circuit 11 works to discharge the electric charge on the gate capacitors of the MOSFET 14 to the ground line 17 through the output terminal 13 and the transistor T12. This causes the output voltage Vo to decrease from the level substantially equal to the voltage Vb rapidly. When the output voltage Vo drops below the threshold value Vth of the MOSFET 14, it will cause the MOSFET 14 to be turned off.

After the MOSFET 14 is turned off, when the output voltage Vo drops further and meets a relation, as shown below, it will cause the transistor T16 to be turned off, so that the transistor T15 is turned on.

$$Vo < (R25+R26)/R26 \cdot Vf \quad (4)$$

Note that the voltage level defined by the right side of Eq. (4) is the level of an off-decision voltage which is set lower than the threshold value Vth of the MOSFET 14.

When the transistor T16 is turned off (i.e., the transistor T15 is turned on), the transistor T25 on the low side is changed from the on-state to the off-state, thus causing the transistors T24 and T12 to be changed from the on-state to the off-state.

Specifically, at least during a change in level of the control signal Sa from the L-level to the H-level when the MOSFET 14 is switched from the on-state to the off-state, the transistor T12 on the low side is turned on, thereby causing the electric charge to be removed quickly from the gate capacitors of the MOSFET 14. When the MOSFET 14 is in the off-state, and Eq. (4) is met, the transistor T12 on the low side is turned off in addition to the transistor T11 on the high side.

The resistors R25 and R26 making up the voltage detector 20 work as pull-down resistors acting on the gate of the MOSFET 14. Thus, even when both the transistors T11 and T12 are turned off, the gate of the MOSFET 14 is not brought into the high-impedance state. If the gate voltage of the MOSFET 14 is elevated over the off-decision voltage due to input of electric noises, it will cause the transistor T12 on the low side to be turned on to decrease the gate voltage of the MOSFET 14, thereby preventing the MOSFET 14 from being turned on in error.

Figure 9:
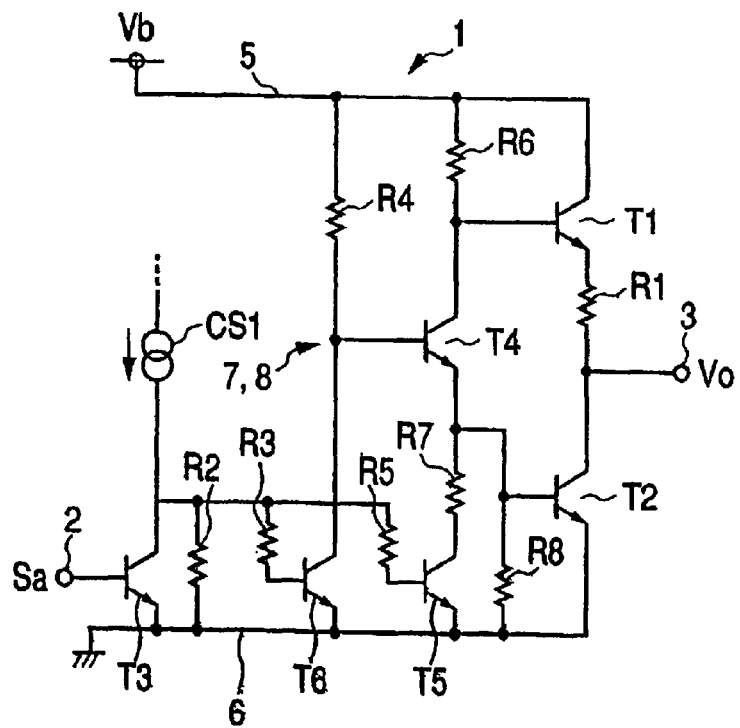
FIG. 9 is a circuit diagram which shows a structure of a conventional drive circuit according to the second embodiment of the invention.
Figure 10:
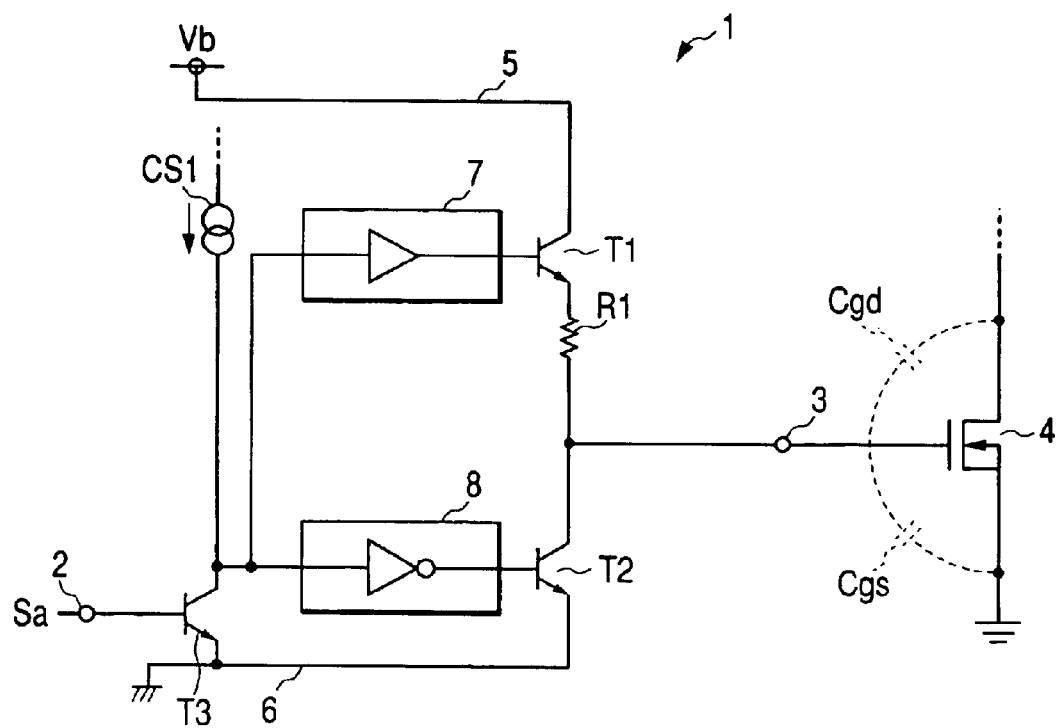
FIG. 10 is a block diagram which shows the drive circuit of FIG. 9.

Current and power consumptions of the drive circuit 11 of this embodiment and the drive circuit 1, as discussed in the introductory part of this application with reference to FIG. 9, when the control signal Sa is in the H-level will be indicated below.

(a) Drive Circuit 11

A decrease in current consumption by turning off of the transistor T12 on the low side is $$(Vb - V_{BE}(T24) - V_{CE}(T25))/R22 + (Vb - V_{BE}(T12) - V_{CE}(T24))/R23 + V_{BE}(T24)/R21 \quad (5)$$

The current and power consumptions when the transistor T12 is in the off-state are given by Eqs. (6) and (7) below.

$$\text{Current Consumption} = 7 \cdot I_{CS} \quad (6)$$

$$\text{Power Consumption} = 4 \cdot I_{CS} \cdot V_{CE} + 3 \cdot I_{CS} \cdot V_{BE} + V_{BE}^2/(R25+R26) \quad (7)$$

where $I_{CS}$ indicates a current value of the constant current sources CS11 to CS17.

In Eq. (7), the first term indicates the power consumption by the current from the constant current sources CS11, CS12, CS16, and CS17. The second term indicates the power consumption by the current from the constant current sources CS13, CS14, and CS15. The third term indicates the power consumption by the output voltage Vo ($V_{BE}(T16)$) when the transistor T12 is turned off.

If Vb=14V, $V_{BE}$=0.7V, $V_{CE}$=0.05V, R25=1 kΩ, R26=100 kΩ, and $I_{CS}$=50 μA which are suitable values in circuit design, the current consumption and the power consumption determined by Eqs. (6) and (7) will be 0.35 mA and 0.12 mW.

(b) Drive Circuit 1

The current and power consumptions in the drive circuit 1 are given by Eqs. (8) and (9) below.

$$\text{Current Consumption} = I_{CS} + (Vb - V_{BE}(T2) - V_{BE}(T4))/R4 + (Vb - V_{BE}(T2) - V_{CE}(T4))/R6 \quad (8)$$

$$\text{Power Consumption} = I_{CS} \cdot V_{CE}(T3) + Vb \cdot (Vb - V_{BE}(T2) - V_{BE}(T4))/R4 + Vb \cdot (Vb - V_{BE}(T2) - V_{CE}(T4))/R6 \quad (9)$$

If Vb=14V, $V_{BE}$=0.7V, $V_{CE}$=0.05V, R4=24 kΩ, R6=3.9 kΩ, and $I_{CS}$=50 μA which are suitable values in circuit design, the current consumption and the power consumption determined by Eqs. (8) and (9) will be 3.97 mA and 54.91 mW.

Compared with the conventional drive circuit 1, the current consumption and the power consumption in the drive circuit 11 of this embodiment when the control signal Sa is in the H-level are decreased by 3.62 mA and 54.79 mW, respectively. This also results in a decrease in heat dissipation of the IC on which the drive circuit 11 is fabricated.

Additionally, compared with a circuit equivalent to the drive circuit 1 from which the voltage detector 20 and the comparator 20 are removed, the current and power consumptions in the drive circuit 11 when the control signal Sa is in the H-level are also decreased.

Figure 3:
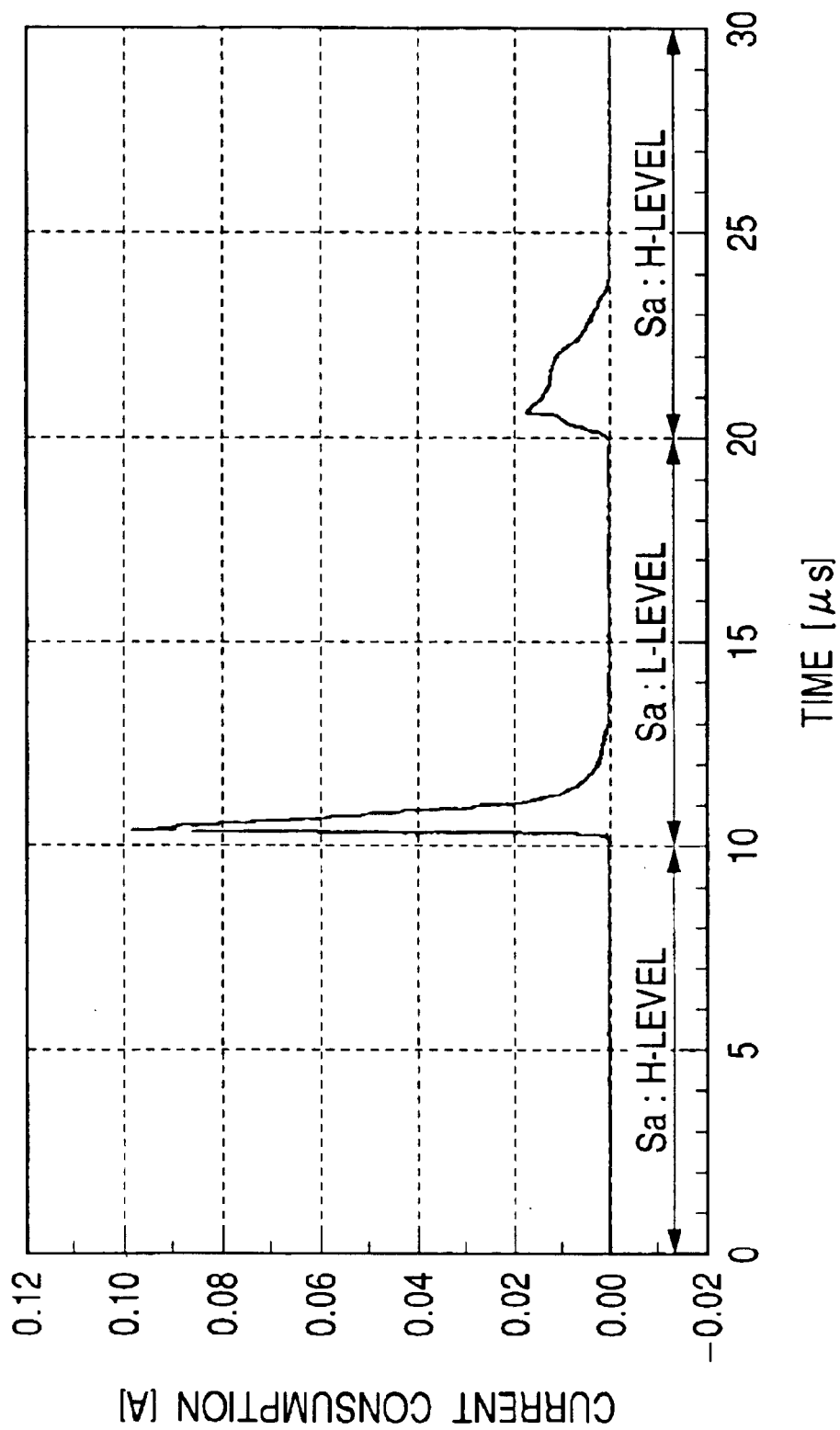
FIG. 3 is a graph which shows a change in current consumption as a function of a change in level of a control signal Sa in the drive circuit shown in FIG. 1.
Figure 4:
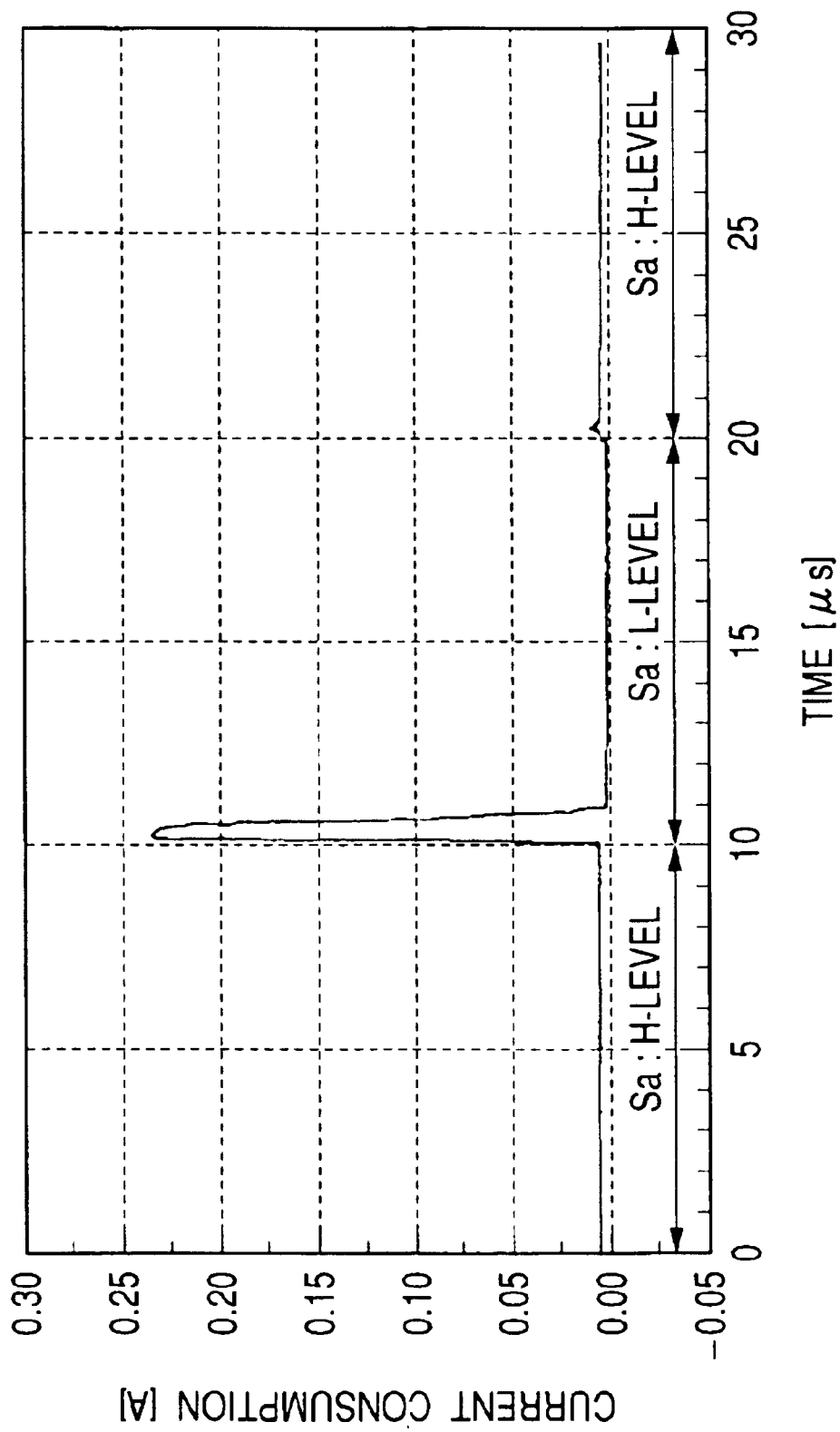
FIG. 4 is a graph which shows a change in current consumption as a function of a change in level of a control signal Sa in a conventional drive circuit shown in FIG. 9.

FIGS. 3 and 4 illustrate the current consumption in the drive circuit 11 and the drive circuit 1 when the control signal Sa is changed from the H-level to the L-level and to the H-level, respectively. The abscissa axis indicates the time (μs) The ordinate axis indicates the current consumption (A). The above described circuit design values are used. The graphs in FIGS. 3 and 4 show that the current consumption in the drive circuit 11 during a time when the control signal Sa is in the H-level (i.e., between 0 to 10 μs, 20 to 30 μs) are decreased greatly as compared with that in the drive circuit 1.

When the control signal Sa is changed from the H-level to the L-level, the transistors T11 and T12 in the drive circuit 11 are both switched from the off-state to the on-state, so that no current flow through the transistors T11 and T12. Specifically, at the instant the control signal Sa is changed from the H-level to the L-level, only a current charged in the MOSFET 14 flows out. The current consumption in the drive circuit 11 is, thus, a maximum of 0.1 A which is smaller than a maximum of 0.24 A in the drive circuit 1.

In the graph of FIG. 3, the current consumption increases slightly just after the control signal Sa is changed from the L-level to the H-level. This is because the time required for turning off the pnp transistor T21 completely is relatively long, so that the current flows therethrough slightly even after the control signal Sa is changed to the H-level. This problem may be alleviated by use of a high-speed transistor as the transistor T21.

As apparent from the above discussion, the driver circuit 11 of this embodiment has the high-side transistor T11 and the low-side transistor T12 connected in series across the output terminal 13 between the power supply line 16 and the ground line 17 and the predrivers 23 and 24 designed to supply a great base current to the transistors T11 and T12 for giving great current output abilities thereto. Specifically, the drive circuit 11 is capable of turning on the transistor T11 through the predriver 23 to charge the gate capacitors of the MOSFET 14 connected to the output terminal 13 with a large quantity of current, thereby resulting in a decreased time required for turning on the MOSFET 14. The drive circuit 11 is also capable of turning on the transistor T12 through the predriver 24 to remove a large quantity of electric charge from the gate capacitors of the MOSFET 14, thereby resulting in a decreased time required for tuning off the MOSFET 14.

The drive circuit 11 also includes the voltage detector 20 designed to detect the output voltage Vo (i.e., the gate voltage of the MOSFET 14) and the comparator 22 designed to compare the detected output voltage Vo with the off-decision voltage lower in level than the threshold value Vth of the MOSFET 14 and works to turn off the predriver 24 when the output voltage Vo is determined to be lower than the off-decision voltage to stop the supply of the base current to the transistor T12. Specifically, during a transitional period of time in which the MOSFET 14 is brought into the off-state, the transistor T12 is turned on, thereby causing the MOSFET 14 to be turned off quickly. After the MOSFET 14 is turned off, the current flowing through the predriver 24 (including the base current of the transistor T12) is cut, thus resulting in a decrease in consumption of current and power in the drive circuit 11. As compared with the conventional drive circuit 1, the heat dissipation from the IC on which the drive circuit 11 is fabricated is decreased greatly without increasing the turning-on time as well as the turning-off time of the MOSFET 14. This allows the drive circuit 11 to be used in a high temperature environment and a large number of drive circuits equivalent to the drive circuit 11 to be built in an IC.

In the drive circuit 11, the longer the time in which the MOSFET 14 is in the off-state, the greater will be the current and power consumptions. The resistors R25 and R26 making up the voltage detector 20 work as pull-down resistors acting on the gate of the MOSFET 14. Therefore, even when the transistors T11 and T12 are turned off, the MOSFET 14 is kept off stably.

Figure 5:
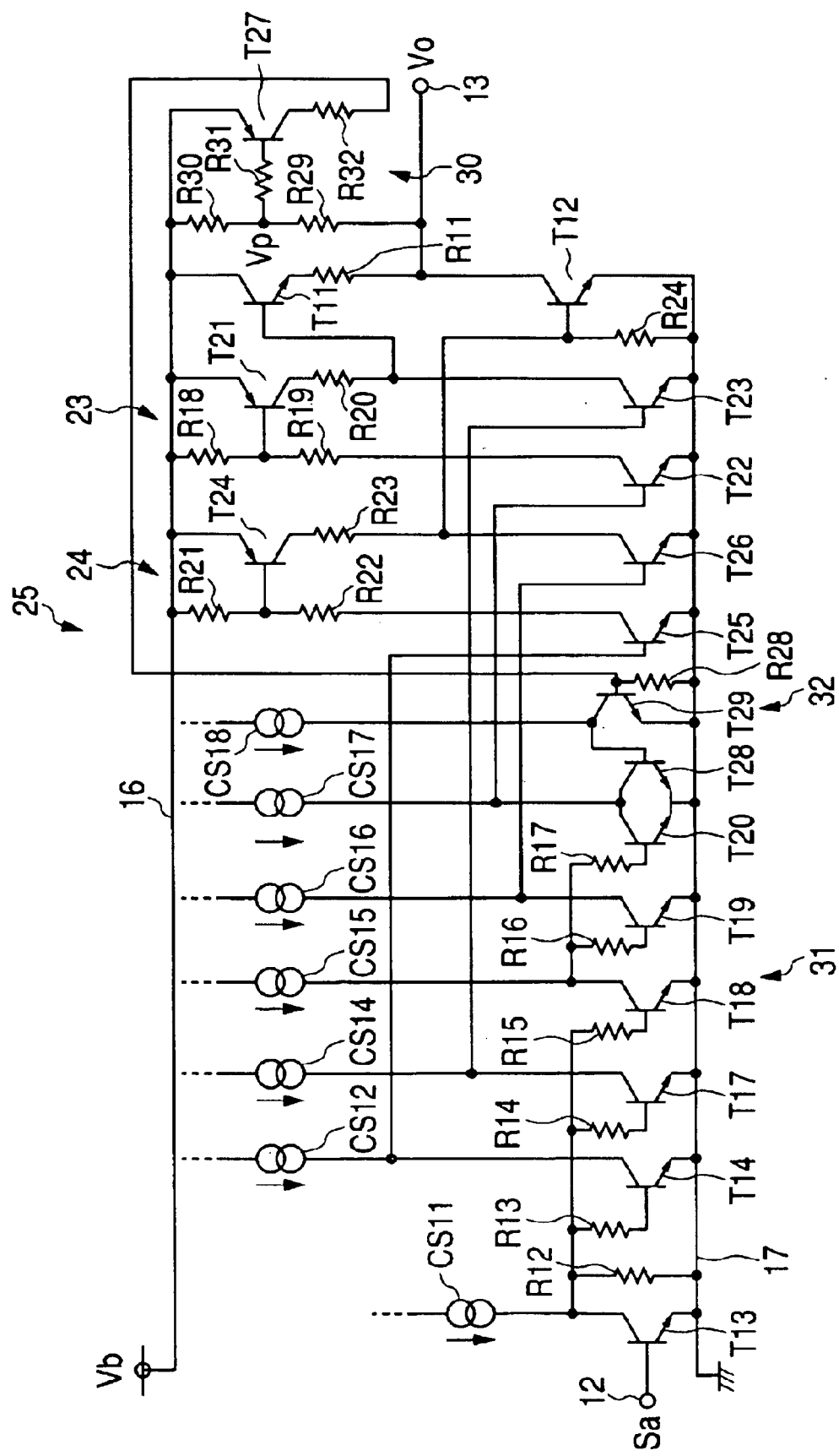
FIG. 5 is a circuit diagram which shows a structure of a drive circuit according to the second embodiment of the invention.
Figure 6:
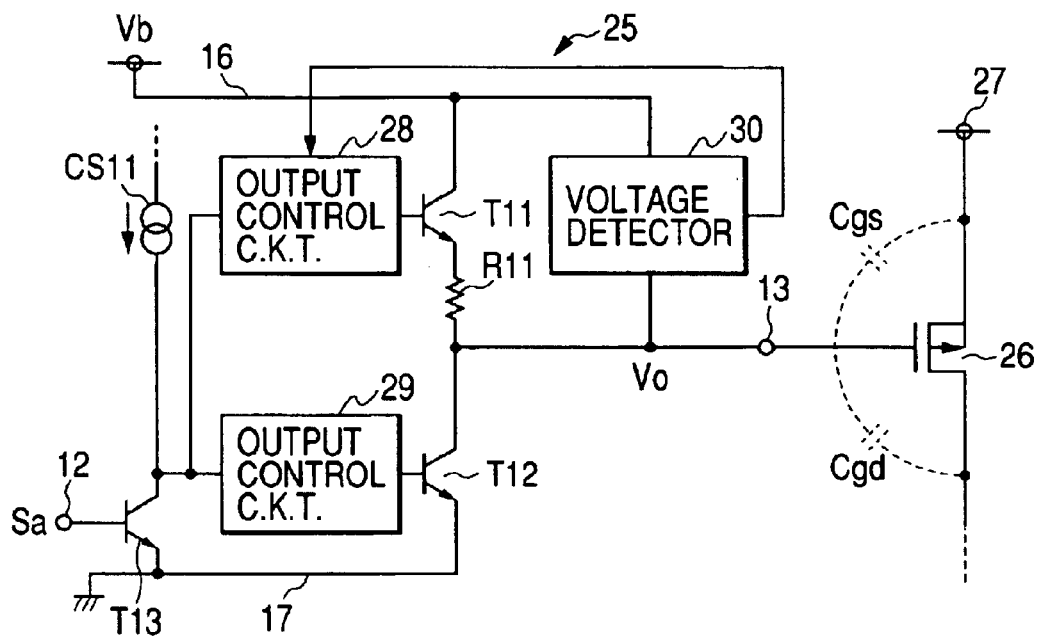
FIG. 6 is a block diagram which shows the drive circuit of FIG. 5.

FIGS. 5 and 6 show a drive circuit 25 according to the second embodiment of the invention. For example, six drive circuits each equivalent to the drive circuit 25 are, like the first embodiment, fabricated in an IC as a six-channel driver and used in engine control for automotive vehicles.

The drive circuit 11 of the first embodiment is designed to reduce the power consumption when the n-channel MOSFET 14 is in the off-state, while the drive circuit 25 of this embodiment is designed to reduce the power consumption when a p-channel MOSFET is in the off-state. The same reference numbers as employed in the first embodiment refer to the same parts, and explanation thereof in detail will be omitted here.

To the output terminal 13 of the IC on which the drive circuit 25 is fabricated, a p-channel MOSFET 26 is connected at a gate thereof. The MOSFET 26 is connected at a drain thereof to an electric load such as a solenoid (not shown) and at a source thereof to a power supply line 27 leading to the positive terminal of the battery. The MOSFET 26 has, like the first embodiment, gate capacitors Cgs and Cgd, as shown by broken lines.

The drive circuit 25 includes an output control circuit 28 for driving the transistor T11, an output control circuit 29 for driving the transistor T12, and a voltage detector 30. The voltage detector 30 is connected between the output terminal 13 and the power supply line 16 to detect the output voltage Vo appearing at the output terminal 13. The transistor T11 and the output control circuit 28 function as a high side switching circuit. The transistor T12 and the output control circuit 29 function as a low side switching circuit. In following discussion, the potential at the power supply line 16 will be defined as a reference potential for expressing the output voltage Vo, and potential levels below that at the power supply line 16 will be expressed in positive values.

The output control circuit 29 includes, as shown in FIG. 5, a comparator 32 and a logic circuit 31. The comparator 32 consists of a constant current source CS18 and an npn transistor T29 serving as a decision transistor. A resistor R28 is connected between a base and an emitter of the transistor T29. The logic circuit 31 has the transistor T20 and the transistor T28 connected in parallel. The transistor T28 is coupled at a base thereof to a collector of the transistor T29.

The voltage detector 30 consists of a voltage divider made up of resistors R29 and R30 connected in series between the output terminal 13 and the power supply line 16, a pnp transistor T27 connected at an emitter to the power supply line 16, and a resistor R31 connected between a base of the transistor T27 and a junction of the resistors R29 and R30. The transistor T27 is connected at a base thereof to a base of the transistor T29 through the resistor R32.

The operation of the drive circuit 25 when the control signal Sa is changed in level will be described below.
(1) When the Control Signal Sa is Changed from the H-level to the L-level A change in level of the control signal Sa from the H-level to the L-level causes the transistor T13 to be turned off, the transistors T14, T17, and T18 to be turned on, and the transistors T19 and T20 to be turned off. This causes, on the low side, the transistor T25 to be turned off, the transistor T26 to be turned on, and the transistors T24 and T12 to be turned off. The collector voltage of the transistors T20 and T28, i.e., the on-off state of the transistors T22 and T11 on the high side depends upon the level of the output voltage Vo.

Specifically, during a time when the output voltage Vo meets a relation, as shown below, after the control signal Sa is decreased to the L-level, the transistors T27 and T29 are in the on-state, so that the transistor T28 is in the off-state.

$$Vo \geq (R29+R30)/R30 \cdot Vf \qquad (10)$$

During the above time period, the collector of the transistors T20 and T28 is in the H-level, thereby causing the transistor T22 to be turned on, the transistor T23 to be turned off, and the transistors T21 and T11 to be turned on.

Thus, the drive circuit 25 discharges the electric charge on the gate capacitors of the MOSFET 26 to the power supply line 16 through the output terminal 13 and the transistor T11. This causes the output voltage Vo to decrease. When the output voltage Vo drops below the threshold value Vth of the MOSFET 26, it will cause the MOSFET 26 to be turned off.

After the MOSFET 26 is turned off, when the output voltage Vo drops further and meets a relation, as shown below, it will cause the transistors T27 and T29 to be turned off, so that the transistor T28 is turned on.

$$Vo < (R29+R30)/R30 \cdot Vf \qquad (11)$$

Note that the voltage level defined by the right side of Eq. (4) is the level of an off-decision voltage which is set lower than the threshold value Vth of the MOSFET 26.

When the transistor T29 is turned off (i.e., the transistor T28 is turned on), the transistor T22 on the high side is changed from the on-state to the off-state, thus causing the transistors T21 and T11 to be changed from the on-state to the off-state. The resistors R29 and R30 making up the voltage detector 30 serve as pull-up resistors acting on the gate of the MOSFET 26.

(2) When the Controls Signal Sa is Changed from the L-level to the H-level

A change in level of the control signal Sa from the L-level to the H-level causes the transistor T13 to be turned on, the transistors T14, T17, and T18 to be turned off, and the transistors T19 and T20 to be turned on. The turning on of the transistor R20 causes the collector potential of the transistors T19 and T20 to be in the L-level regardless of the level of the output voltage Vp detected by the voltage detector 30. This causes, on the high side, the transistor T22 to be turned off, the transistor T23 to be turned on, and the transistors T21 and T11 to be turned off, while, on the low side, it causes the transistor T25 to be turned on, the transistor T26 to be turned off, and the transistors T24 and T12 to be turned on. When the output voltage Vo exceeds the threshold value Vth of the MOSFET 26, the MOSFET 26 is turned on.

As apparent from the above discussion, the driver circuit 25 of the second embodiment has the voltage detector 30 designed to detect a potential difference between the power supply line 16 and the output terminal 13 (i.e., the output voltage Vo defined based on the potential at the power supply line 16) and the comparator 32 designed to compare the detected output voltage Vo with the off-decision voltage lower in level than the threshold value Vth of the MOSFET 26 and works to turn off the predriver 23 when the output voltage Vo is determined to be lower than the off-decision voltage to stop the supply of the base current to the transistor T11. Specifically, during a transitional period of time in which the MOSFET 26 is brought into the off-state, the transistor T11 is turned on, thereby bringing the MOSFET 26 into the off-state quickly. After the MOSFET 26 is turned off, the current flowing through the predriver 23 (including the base current of the transistor T11) is cut, thus resulting in a decrease in consumption of current and power in the drive circuit 25. The longer the time in which the MOSFET 26 is in the off-state, the greater will be the current and power consumptions.

Figure 7:
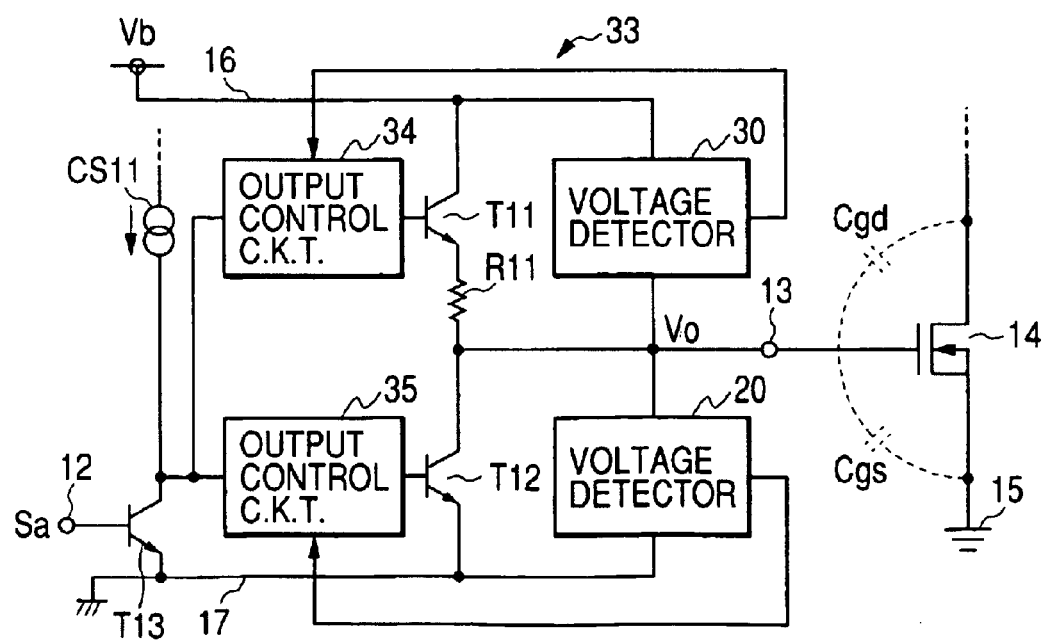
FIG. 7 is a block diagram which shows a drive circuit according to the third embodiment of the invention.

FIG. 7 shows a drive circuit 33 according to the third embodiment of the invention. The same reference numbers as employed in FIGS. 2 and 6 will refer to the same parts, and explanation thereof in detail will be omitted here.

The drive circuit 33 is designed to drive an n-channel MOSFET 14 and has a structure equivalent to a combination of those in FIGS. 2 and 6. Specifically, the output control circuit 34 for driving the transistor T11 has a structure consisting of components of the output control circuits 18 and 28.

The drive circuit 33 also includes the voltage detectors 20 and 30. In this embodiment, the voltage level determined by the right side of Eqs. (10) and (11) is the level of an on-decision voltage which lies within a voltage range in which the MOSFET 14 is turned on.

Therefore, when the control signal Sa is changed in level for turning on the MOSFET 14, the drive circuit 33 turns on the transistor T11 on the high side. Alternatively, when the control signal Sa is changed in level for turning off the MOSFET 14, the drive circuit 33 turns on the transistor T12 on the low side. This charges or discharges the gate capacitors of the MOSFET 14 quickly.

In a steady state after the MOSFET 14 is turned on or off, the predrivers 34 and 35 are both turned off to cut the supply of the base current to the transistors T11 and T12, which results in decreases in current and power consumption of the drive circuit 33 regardless of an operational pattern of the MOSFET 14 (i.e., an on state-to-off state ratio), thus lowering the heat dissipation of the IC on which the drive circuit 33 is fabricated further as compared with the drive circuit 11.

Figure 8:
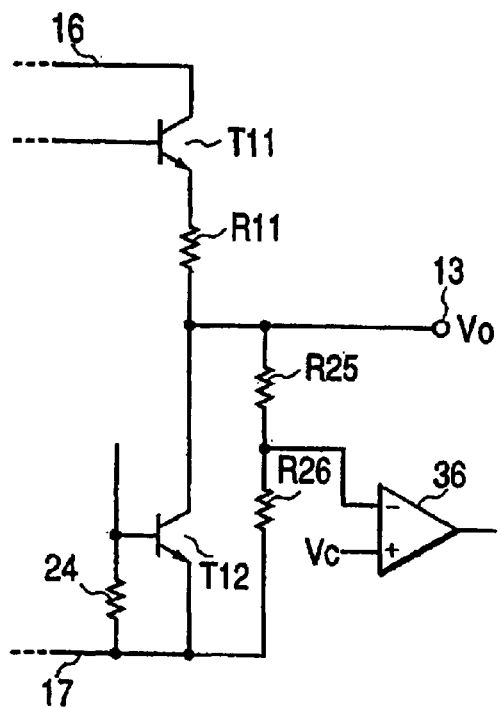
FIG. 8 is a block diagram which shows a comparator which may be employed in the drive circuit of FIG. 1.

FIG. 8 shows a comparator 36 which may be used instead of the comparator 22, as shown in FIG. 1, consisting the constant current source CS13 and the npn transistor T16. The comparator 36 is connected at an inverting input to a junction of the resistors R25 and R26 making up the voltage divider and at a non-inverting input to a constant voltage Vc equivalent to the off-decision voltage as described above. The comparator 36 is also connected at an output to the base of the transistor T15 shown in FIG. 1.

With the above arrangements, it is possible to change the off-decision voltage Vc directly without changing a fraction of the total voltage across the voltage divider appearing at the intermediate tap or junction of the resistors R25 and R26. As compared with a case where the base-emitter voltage Vf of the transistor T16 is used as a reference voltage, the accuracy of voltage comparison is improved.

A drive circuit according to the fourth embodiment will be described below which is a modification of the one in the second embodiment.

Specifically, the drive circuit of this embodiment is identical in structure with the drive circuit 25 as shown in FIGS. 5 and 6, but designed to drive the n-channel MOSFET 14 instead of the MOSFET 26, that is, to reduce the current and power consumption thereof when the MOSFET 14 is in the on-state.

In operation, the voltage detector 30 detects the output voltage Vo appearing at the output terminal 13. When the output voltage Vo exceeds an on-decision voltage which is determined by the right side of Eq. (11) lying within a voltage range in which the MOSFET 14 is turned on., the drive circuit turns off a high-side switching circuit consisting of the transistors T11, T21, and T22 and the resistors R18 and R19. This results in great decreases in current and power consumption, especially when the n-channel MOSFET 14 is kept on for a long period of time.

Other operations of the drive circuit are identical with those in the drive circuit 25, and explanation thereof in detail will be omitted here.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments witch can be embodied without departing from the principle of the invention as set forth in the appended claims.

For example, each of the drive circuits 11, 25, and 33 may be used for driving a switching element such as a bipolar transistor or an IGBT. The switching element driven by each of the drive circuits 11, 25, and 33 may be of a p-type, an n-type, a pnp-type, or an npn-type. Each of the drive circuits 11, 25, and 33 may alternatively be made up of MOSFETs.

In the third embodiment, one of the voltage detectors 20 and 30, e.g., the voltage detector 30 may be omitted. In this case, the output control circuits 34 and 35 are designed to perform a comparison operation, logic operations, and predriver controlling operations based on the voltage Vp detected by the voltage detector 20.

What is claimed is:

1. A drive circuit for driving a switching element comprising:
    a high-side switching circuit connected between power supply lines;
    a low-side switching circuit connected in series with said high-side switching circuit through an output terminal leading to the switching element; and
    a voltage detector detecting a voltage appearing at the output terminal,
    wherein said low-side switching circuit is controlled to be turned off when the voltage detected by said voltage detector is lower than an off-decision voltage which is defined within a voltage range in which the switching element is in an off-state, said high-side switching circuit being placed in an off-state when said low-side switching circuit is placed in an on-state, so that after said low-side switching circuit is brought into the off-state, both said high-side and low-side switching circuits are placed in the off-state.

2. A drive circuit as set forth in claim 1, wherein said low-side switching circuit includes an output transistor, a predriver driving the output transistor, a comparing circuit comparing the output voltage detected by said voltage detector with the off-decision voltage, and a logic circuit controlling an operation of the predriver base on a result of comparison in the comparing circuit.

3. A drive circuit as set forth in claim 2, wherein the comparing circuit is implemented by a comparator.

4. A drive circuit as set forth in claim 2, wherein the comparing circuit includes a decision transistor having a control terminal into which the output voltage detected by said voltage detector is inputted.

5. A drive circuit as set forth in claim 1, wherein said voltage detector is implemented by a voltage divider made up of resistors.

6. A drive circuit for driving a switching element comprising:
    a high-side switching circuit connected between power supply lines;
    a low-side switching circuit connected in series with said high-side switching circuit through an output terminal leading to the switching element; and
    a voltage detector detecting a voltage appearing at the output terminal;
    wherein said high-side switching circuit is turned off when the voltage detected by said voltage detector is higher than an on-decision voltage which is defined within a voltage range in which the switching element is in an on-state, said low-side switching circuit being placed in an off-state when said high-side switching circuit is placed in an on-state, so that after said high-side switching circuit is brought into the off-state, both said high-side and low-side switching circuits are placed in the off-state.

7. A drive circuit as set forth in claim 6, wherein said high-side switching circuit includes an output transistor, a predriver driving the output transistor, a comparing circuit comparing the output voltage detected by said voltage detector with the on-decision voltage, and a logic circuit controlling an operation of the predriver base on a result of comparison in the comparing circuit.

8. A drive circuit as set forth in claim 7, wherein the comparing circuit is implemented by a comparator.

9. A drive circuit as set forth in claim 7, wherein the comparing circuit includes a decision transistor having a control terminal into which the output voltage detected by said voltage detector is inputted.

10. A drive circuit as set forth in claim 6, wherein said voltage detector is implemented by a voltage divider made up of resistors.

11. A drive circuit for driving a switching element comprising:
    a high-side switching circuit connected between power supply lines;
    a low-side switching circuit connected in series with said high-side switching circuit through an output terminal leading to the switching element; and
    a voltage detector detecting a voltage appearing at the output terminal;
    wherein said low-side switching circuit is turned off when the voltage detected by said voltage detector is lower than an off-decision voltage which is defined within a voltage range in which the switching element is in an off state, said high-side switching circuit being placed in an off-state when said low-side switching circuit is placed in an on-state, so that after said low-side switching circuit is brought into the off-state, both said high-side and low-side switching circuits are placed in the off-state, and
    wherein said high-side switching circuit is turned off when the voltage detected by said voltage detector is higher than an on-decision voltage which is defined within a voltage range in which the switching element is in an on state, said low-side switching circuit being placed in an off-state when said high-side switching circuit is placed in an on-state, so that after said high-side switching circuit is brought into the off-state, both said high-side and low-side switching circuits are placed in the off-state.

12. A drive circuit as set forth in claim 11, wherein said low-side switching circuit includes an output transistor, a predriver driving the output transistor, a comparing circuit comparing the output voltage detected by said voltage detector with the off-decision voltage, and a logic circuit controlling an operation of the predriver base on a result of comparison in the comparing circuit.

13. A drive circuit as set forth in claim 11, wherein said high-side switching circuit includes an output transistor, a predriver driving the output transistor, a comparing circuit comparing the output voltage detected by said voltage detector with the on-decision voltage, and a logic circuit controlling an operation of the predriver base on a result of comparison in the comparing circuit.

14. A drive circuit as set forth in claim 13, wherein the comparing circuit includes a decision transistor having a control terminal into which the output voltage detected by said voltage detector is inputted.

15. A drive circuit as set forth in claim 11, wherein said voltage detector is implemented by a voltage divider made up of resistors.

16. A drive circuit as set forth in claim 1, wherein said high-side switching circuit is also controlled to be turned off during the off state of the switching element so that a maximum of 0.1 A flows through either said high-side switching circuit or said low-side switching circuit when the voltage detected by said voltage detector is lower than the off-decision voltage.

17. A drive circuit as set forth in claim 11, wherein said high-side switching circuit is also controlled to be turned off during the off state of the switching element so that a maximum of 0.1 A flows through either said high-side switching circuit or said low-side switching circuit when the voltage detected by said voltage detector is lower than the off-decision voltage.

18. A drive circuit as set forth in claim 1, wherein said low-side switching circuit is turned on for dissipating electric charges from a switching element gate capacitor when the switching element is switched to the off-state.

19. A drive circuit as set forth in claim 11, wherein said low-side switching circuit is turned on for dissipating electric charges from a switching element gate capacitor when the switching element is switched to the off-state.

20. A drive circuit as set forth in claim 1, wherein said low-side switching circuit and said high-side switching circuit comprise bipolar transistors that are selectively turned on and off by controlling respective base currents thereof.

21. A drive circuit as set forth in claim 6, wherein said low-side switching circuit and said high-side switching circuit comprise bipolar transistors that are selectively turned on and off by controlling respective base currents thereof.

22. A drive circuit as set forth in claim 11, wherein said low-side switching circuit and said high-side switching circuit comprise bipolar transistors that are selectively turned on and off by controlling respective base currents thereof.

23. A drive circuit as set forth in claim 6, wherein paid low-side switching circuit is also controlled to be turned off during the on state of the switching element so that a maximum of 0.1 A flows through either said high-side switching circuit or said low-side switching circuit when the voltage detected by said voltage detector is higher than the on decision voltage.

24. A drive circuit as set forth in claim 11, wherein said low-side switching circuit is also controlled to be turned off during the on state of the switching element so that a maximum of 0.1 A flows through either said high-side switching circuit or said low-side switching circuit when the voltage detected by said voltage detector is higher than the on decision voltage.

25. A drive circuit as set forth in claim 6, wherein said high-side switching circuit is turned on for charging a switching element gate capacitor when the switching element is switched to the on state.

26. A drive circuit as set forth in claim 11, wherein said high-side switching circuit is turned on for charging a switching element gate capacitor when the switching element is switched to the on state.

* * * * *